United States Patent
Akram et al.

(10) Patent No.: US 6,194,243 B1
(45) Date of Patent: *Feb. 27, 2001

(54) METHOD OF PRODUCTION AN UNDERFILL OF A BUMPED OR RAISED DIE USING A BARRIER ADJACENT TO THE SIDEWALL OF A SEMICONDUCTOR DEVICE

(75) Inventors: Salman Akram; James M. Wark, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/304,502

(22) Filed: May 3, 1999

Related U.S. Application Data

(60) Continuation of application No. 08/910,299, filed on Aug. 11, 1997, now Pat. No. 5,973,404, which is a division of application No. 08/612,125, filed on Mar. 7, 1996, now Pat. No. 5,766,982.

(51) Int. Cl.[7] ................................................. H01L 21/00
(52) U.S. Cl. ........................ 438/51; 438/108; 438/126; 438/127
(58) Field of Search ............................. 438/51, 63, 107, 438/108, 109, 117, 118, 120, 124, 126, 127; 257/737, 738, 778, 779, 782, 783, 787

(56) References Cited

U.S. PATENT DOCUMENTS

| | | | |
|---|---|---|---|
| 5,203,076 | 4/1993 | Banerji et al. ......................... | 29/840 |
| 5,218,234 | 6/1993 | Thompson et al. ................... | 257/787 |
| 5,239,447 | 8/1993 | Cotues et al. ......................... | 361/744 |
| 5,258,648 | 11/1993 | Lin ......................................... | 257/778 |
| 5,289,346 | 2/1994 | Carey et al. ........................... | 361/777 |
| 5,311,059 | 5/1994 | Banerji et al. ........................ | 257/778 |
| 5,371,404 | 12/1994 | Juskey et al. ......................... | 257/659 |
| 5,385,869 | 1/1995 | Liu et al. ............................... | 438/126 |
| 5,403,439 | 4/1995 | Matthews .............................. | 156/662 |
| 5,410,181 | 4/1995 | Zollo et al. ............................ | 257/681 |
| 5,436,503 | 7/1995 | Kunitomo et al. .................... | 257/737 |
| 5,438,219 | 8/1995 | Kotzan et al. ......................... | 257/469 |
| 5,439,162 | 8/1995 | George et al. .................. | 228/180.22 |
| 5,442,240 | 8/1995 | Mukerji ................................. | 257/783 |
| 5,450,283 | 9/1995 | Lin et al. ............................... | 361/704 |
| 5,468,995 | 11/1995 | Higgins, III ........................... | 257/697 |
| 5,498,576 | 3/1996 | Hotchkiss et al. .................... | 438/63 |
| 5,532,187 | 7/1996 | Schreiber-Prillwitz et al. ...... | 438/51 |
| 5,590,462 | 1/1997 | Hundt et al. ........................... | 29/840 |
| 5,697,148 | 12/1997 | Lance, Jr. et al. .................... | 29/840 |
| 5,766,982 | * 6/1998 | Akram et al. ......................... | 438/51 |
| 5,973,404 | * 10/1999 | Akram et al. ......................... | 257/778 |
| 6,066,509 | * 5/2000 | Akram et al. ......................... | 438/51 |

FOREIGN PATENT DOCUMENTS 57-95651    6/1982    (JP) .

\* cited by examiner

*Primary Examiner*—Olik Chaudhuri
*Assistant Examiner*—Alonzo Chambliss
(74) *Attorney, Agent, or Firm*—Trask Britt

(57) ABSTRACT

A method and apparatus for attaching a semiconductor device to a substrate. One end of the substrate is elevated to position the substrate and the coupled semiconductor device on an inclined plane. An underfill material is introduced along a wall of the semiconductor device located at the elevated end of the inclined substrate with the underfill material being placed between the substrate and the semiconductor device. An optional but preferred additional step of the invention includes coupling a barrier means to the substrate at a point on the substrate adjacent to a sidewall of the semiconductor device located at the lowest point of the slope created by the inclined substrate. The barrier means prevents the underfill material from spreading beyond the sidewalls of the semiconductor device, particularly in instances where the substrate is inclined at a steep angle.

36 Claims, 3 Drawing Sheets

METHOD OF PRODUCTION AN UNDERFILL OF A BUMPED OR RAISED DIE USING A BARRIER ADJACENT TO THE SIDEWALL OF A SEMICONDUCTOR DEVICE

CROSS REFERENCE TO RELATED APPLICATION

This application is a continuation of application Ser. No. 08/910,299, filed Aug. 11, 1997, now U.S. Pat. No. 5,973,404, which is a divisional of application Ser. No. 08/612,125, filed Mar. 7, 1996, now U.S. Pat. No. 5,766,982, issued Jun. 16, 1998.

BACKGROUND OF THE INVENTION

1. Field of the Invention

The present invention relates to a method and apparatus for underfilling a semiconductor device. More specifically, the present invention relates to a method and apparatus for uniformly underfilling a bumped or raised semiconductor chip to be essentially void free.

2. State of the Prior Art

Flip-chip and bumped die technology is well known in the art. A flip-chip or bumped (raised) die is a semiconductor chip (die) having bumps on the bond pads formed on the active surface or front side thereof, the bumps being used as electrical and mechanical connectors, which is inverted (flipped) and bonded to a substrate by means of the bumps. Several materials are typically used to form the bumps on the die, such as conductive polymers, solder, etc. Typically, if the bumps are solder bumps, the solder bumps are reflowed to form a solder joint between the so-called flip-chip and the substrate, the solder joint forming both electrical and mechanical connections between the flip-chip and substrate. In any event, due to the presence of the bumps on the flip-chip, a gap exists between the substrate and the bottom surface of the flip-chip.

Typically, since the flip-chip and the substrate have different coefficients of thermal expansion and operate at different temperatures and also have different mechanical properties with differing attendant reactions to mechanical loading and stresses, stress develops in the joints formed by the bumps between the flip-chip and substrate. Therefore, the bumps must be sufficiently robust to withstand such stressful conditions to maintain the joint between the flip-chip and the substrate. To enhance the joint integrity formed by the bumps located between the flip-chip and the substrate, an underfill material comprised of a suitable polymer is introduced in the gap between the flip-chip and the substrate. The underfill also serves to equalize stress placed on the flip-chip and substrate, helps transfer heat from the flip-chip and helps protect the bump connections located between the flip-chip and the substrate from contaminants such as moisture, chemicals, and contaminating ions.

In practice, the underfill material is typically dispensed into the gap between the flip-chip and the substrate by injecting the underfill along two or more sides of the flip-chip with the underfill material flowing, usually by capillary action, to fill the gap. For example, U.S. Pat. No. 5,218,234 to Thompson et al. discloses a semiconductor device assembly whereby an epoxy underfill is accomplished by applying the epoxy around the perimeter of the flip-chip mounted on the substrate and allowing the epoxy to flow underneath the chip. Alternatively, the underfill can be accomplished by backfilling the gap between the flip-chip and the substrate through a hole in the substrate beneath the chip.

However, the traditional method of underfilling by way of capillary action has a serious disadvantage. The small gap formed between the flip-chip and substrate to which it is connected prevents filling the gap in a uniform manner. Such non-uniform underfilling is particularly prevalent in the areas surrounding the bumps interconnecting the flip-chip to the substrate. When underfilling a flip-chip on a substrate situated in a substantially horizontal plane, the underfill material will generally be non-uniform in character and contain bubbles, air pockets, or voids therein. This non-uniform underfill decreases the underfill material's ability to protect the interconnections between the flip-chip and substrate and environmentally compromises the flip-chip itself thereby leading to a reduction in the reliability of the chip.

A different method of bonding a semiconductor chip to a substrate is disclosed in U.S. Pat. No. 5,385,869 to Liu et al. whereby the gap between the semiconductor chip and substrate is underfilled utilizing a substrate having a through hole formed therein which is centrally located below the semiconductor chip mounted thereon. The through hole has gates or notches formed at each corner thereof which extend beyond the semiconductor chip, which is mounted thereover. Underfilling the gap between the semiconductor chip and the substrate is accomplished by blocking one side of the through hole, applying an encapsulation material on top of and around the chip, and allowing the encapsulation material to flow into the through hole by way of the gates or notches in the substrate.

As disclosed in U.S. Pat. No. 5,203,076 to Banerji et al., a vacuum chamber is used to underfill the gap between a semiconductor chip and a substrate. A bead of underfill polymeric material is provided on the substrate about the periphery of the chip. Next, the semiconductor chip and substrate are placed within a vacuum chamber with a vacuum being subsequently applied to the chip and the substrate to evacuate the gap therebetween. Air is then slowly allowed to re-enter the vacuum chamber to force the underfill material into the gap between the semiconductor chip and the substrate.

Although the underfill methods disclosed in the Liu and Banerji patents attempt to address the problem of underfilling in a non-uniform manner, those references present solutions that require specialized substrates, use additional equipment in the underfilling process and increase the cost of production. For example, implementation of the underfilling method illustrated in the Liu reference requires the use of a specialized substrate having a through hole therein. Similarly, the underfilling method illustrated in the Banerji et al. reference requires the use of specialized equipment in the form of a vacuum chamber.

Therefore, it would be advantageous to develop a method for performing underfill of semiconductor chips which results in underfill material that is uniform and substantially free of voids or air. It would be a further improvement to develop a method for performing uniform underfilling of the gap between the flip-chip and substrate that is cost effective and utilizes standard substrates.

SUMMARY OF THE INVENTION

The present invention is directed to an improved method and apparatus for underfilling the gap between a semiconductor device (flip-chip) and substrate. The improved method of attaching a semiconductor device to a substrate begins with the step of electrically connecting the semiconductor device to the substrate. Next, one end of the substrate is elevated to a position where the substrate and semiconductor device are located on an inclined or tilted plane. Finally, an underfill material is introduced along the sidewall of the semiconductor device located at the elevated end of the inclined substrate with the underfill flowing into and filling the gap formed between the substrate and the semiconductor device.

The improved method of the present invention may include the step of using a suitable dam or barrier located adjacent to the lower edge of the inclined substrate, the lowest point of the inclined substrate. The suitable dam or barrier prevents the underfill material from spreading beyond the sidewalls of the semiconductor device, particularly in instances where the substrate is inclined at a steep angle with respect to a horizontal plane.

BRIEF DESCRIPTION OF THE SEVERAL VIEWS OF THE DRAWINGS

The advantages, as well as other novel and important features of the present invention will be better understood when the following description is read along with the accompanying drawings of which.

DETAILED DESCRIPTION OF THE INVENTION

Figure 1:
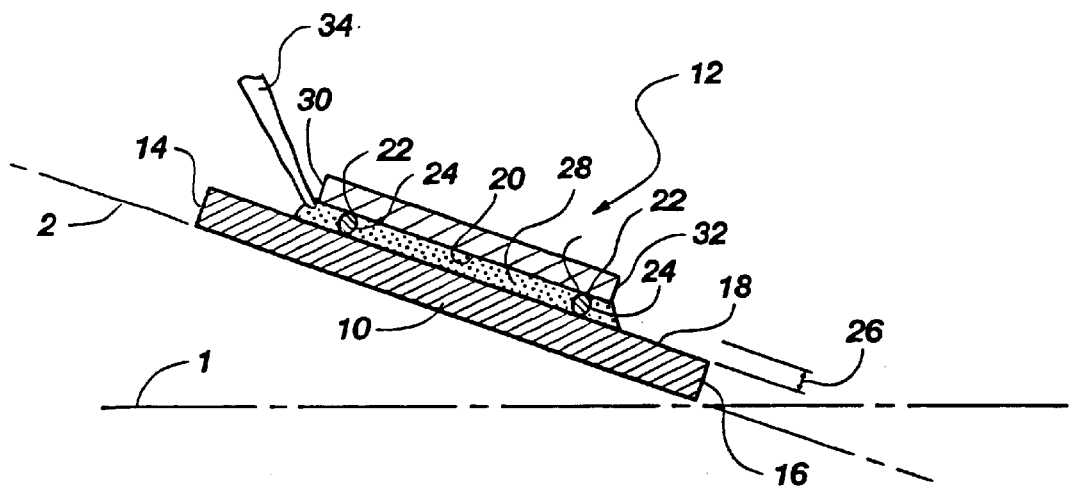
FIG. 1 is a cross-sectional view of a preferred underfill dispensing step for a semiconductor device, a bumped flip-chip, and an inclined substrate in accordance with the present invention.

Referring to FIG. 1, a substrate or chip carrier 10 is shown for connecting a semiconductor device or flip-chip 12 by conventional direct chip bonding techniques. Substrate 10 is typically made of ceramic, silicone, glass, and combinations thereof. Substrate 10 is preferably comprised of a printed circuit board (PCB) or other carrier, which is used in flip-chip technology, such as an FR4 PCB. Substrate 10 has a front end 14, a rear end 16, and a top surface 18, the top surface 18 having contact pads thereon.

Flip-chip 12 has a front sidewall 30, a rear sidewall 32, and an active surface 20. The active surface 20 comprises integrated circuitry and a plurality of contact pads 22. The contact pads 22 have bumps 24 thereon, which provide both electrical and mechanical connection to substrate 10.

An electrical assembly is produced by placing and securing the flip-chip 12 on the top surface 18 of substrate 10 having active circuitry thereon. Specifically, the bumps 24 are aligned with the contact pads of the active circuitry located on top surface 18 of substrate 10. The flip-chip 12 is then electrically and mechanically connected to the substrate 10 by curing or reflowing the bumps 24, depending upon type of material comprising the bumps 24. Alternatively, the bumps 24 may be formed on the substrate prior to attachment of the flip-chip. In other words, either surface may bear the bumps thereon. Although bumps 24 are typically formed with solder, it is understood that any other materials known in the art (e.g. gold, indium, tin, lead, silver or alloys thereof) that reflow to make electrical interconnects to substrate 10 can also be used. Additionally, the bumps 24 may be formed of conductive polymeric and epoxy materials and may include various metals being plated thereon.

After reflowing of the bumps 24, a space or gap 26 is formed between the active surface 20 of flip-chip 12 and the top surface 18 of substrate 10. The size of the gap 26 is controlled by the size of the reflowed solder bumps and typically varies from approximately 3 to about 10 mils.

Next, an underfill material 28 is applied to fill the gap 26 between the flip-chip 12 and the substrate 10. As previously stated, the purpose of the underfill material 28 is to environmentally seal the active surface 20 of the flip-chip 12 and the bumps 24, help provide an additional mechanical bond between the flip-chip 12 and the substrate 10 to help prevent, distribute stress on the flip-chip 12 and bumps 24 and to help transfer heat from the flip-chip 12. The underfill material is typically a polymeric material, such as an epoxy or an acrylic resin and may contain inert filler material therein. The underfill material 28 typically has a thermal coefficient of expansion that approximates that of the flip-chip 12 and/or the substrate 10 to help minimize stress placed on either the flip-chip 12 or the substrate 10 during the operation of the flip-chip caused by the heating of the underfill material 28. To promote filling of the gap between the substrate 10 and flip-chip 12, the viscosity of the underfill material 28 is controlled taking into account the flow characteristics of the underfill material, the material characteristics of the substrate 10, the material characteristics of the flip-chip 12, and the size of the gap 26.

Figure 3:
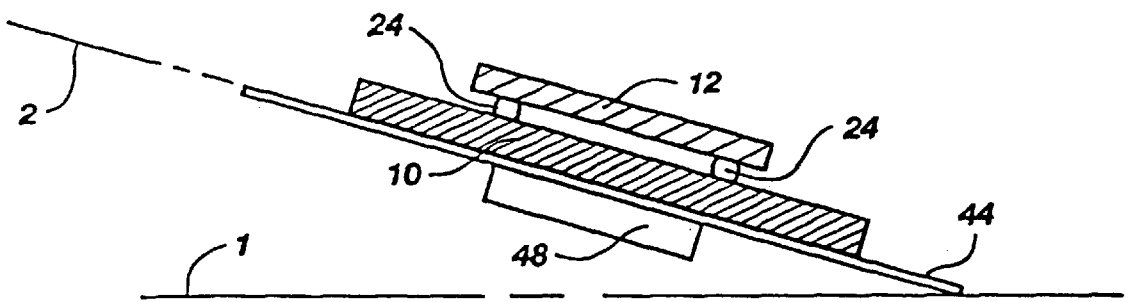
FIG. 3 is a side view illustrating the placement of the semiconductor device, bumped flip-chip, and substrate of FIG. 1 on top of a support member having a vibrator attached thereto.

As shown, the underfill process is started by elevating or inclining the front end 14 of the substrate 10 in order to position the substrate 10 on an inclined plane 2 with respect to a horizontal plane 1. The angle of elevation or inclination of the inclined plane 2 and the attendant substrate 10 and flip-chip 12 is dependent on the viscosity or the rate of dispensing of the underfill material 28. The viscosity of the underfill material 28 should be adjusted to allow facile flow of the underfill material 28 but should be left low enough to readily prevent the flow of the underfill material 28 beyond the perimeter of the flip-chip 12. It should also be understood that the substrate 10 may be inclined by placing the substrate 10 on a support member 44, such as a tilted table or conveyor belt, as is shown in FIG. 3 and further described below. Alternately, the substrate 10 may be inclined by placing the substrate 10 below a support member or horizontal plane 1 as described hereinbelow.

Underfilling is accomplished by applying the underfill material 28 under the front sidewall 30 of flip-chip 12 and allowing it to flow between the flip-chip 12 and the substrate 10 and around the bumps 24. The underfill material 28 is applied with an underfill dispenser 34, such as a syringe having a suitable nozzle thereon or any other suitable dispensing means known in the art.

As shown, since the substrate 10 having flip-chip 12 thereon is placed on an incline, in addition to any fluid pressure used to inject the underfill material and any capillary action force acting on the underfill material, a gravitational force also acts on the underfill material, causing the underfill material 28 to readily flow from front sidewall 30 toward rear sidewall 32. Due to the additional action of the gravitational force to that of the injection pressure and capillary action, air pockets, bubbles, and voids found within the underfill material 28 are displaced by the denser underfill material 28 as it flows toward the rear sidewall 32 of flip-chip 12. The ability to displace and the speed of displacement of the voids is dependent on the inclined angle of the substrate 10 having flip-chip 12 thereon, the viscosity of the underfill material 28, the injection rate of the underfill material 28, and the uniformity of the injection of the underfill material 28 into the gap between the substrate 10 and the flip-chip 12 to form a substantially uniform flow front of underfill into and through the gap. If desired, the process of underfilling the gap may be repeated by inclining the substrate 10 in the opposite direction and subsequently dispensing another amount of underfill material 28 from an opposing side of the flip-chip 12 into the gap to improve the uniformity of the underfill material 28 filling the gap.

After application of the underfill material 28, the material is cured either by heat, ultraviolet light, radiation, or other suitable means in order to form a solid mass.

Figure 2:
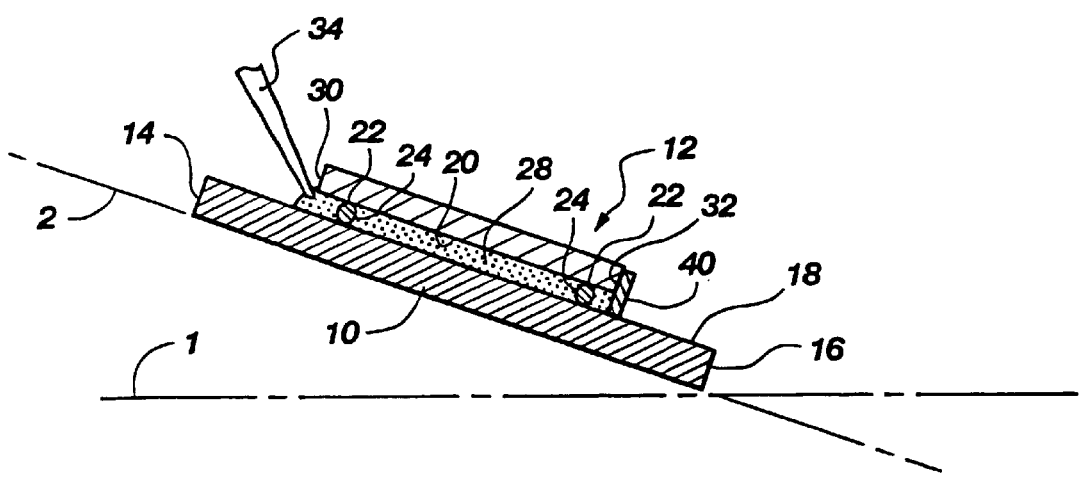
FIG. 2 is a cross-sectional view of another preferred underfill dispensing method, which illustrates the placement of a suitable barrier, a dam, located adjacent the substrate.

Referring now to FIG. 2, a second embodiment of an interconnected flip-chip 12 and substrate 10 is shown. As shown, a dam or barrier 40 is used on the top surface 18 of the substrate 10 to help contain the flow of the underfill from the gap at the rear sidewall 32 of the flip-chip 12. Conventional molding equipment and techniques (e.g. pour molding, injection molding, adhesive bonding, etc.) can be used to form the dam 40 on the substrate 10. The dam 40 is typically formed from any suitable epoxy resin material compatible with the substrate 10.

The dam 40 extends upwards from and is substantially perpendicular to the top surface 18 of the substrate 10. As shown, the dam 40 may be seen to lay substantially parallel and slightly aft the rear sidewall 32 of the flip-chip 12.

The dam 40 limits the expansion or gravitational flow of the underfill material 28 beyond the position of the dam 40. During the underfill procedure, the underfill material 28 coats and spreads out onto the surfaces of the flip-chip 12 and substrate 10. The dam 40 prevents the spread of underfill material 28 beyond the rear sidewall 32 of the flip-chip 12 by means of surface tension.

Additionally, use of the dam 40 (as opposed to using no dam) permits use of lower viscosity underfill materials, if so desired, during the underfill procedure. The underfill material may be easily controlled and a wider range of viscosities may be used by controlling the depth of the dam 40 and by controlling the width between the rear sidewall 32 of the flip-chip 12 and the dam 40. Use of the dam 40 also permits tilting the substrate 10 at a greater angle of elevation with respect to the horizontal plane 1 in order to accelerate the underfill process or to permit the use of higher viscosity underfill materials should such a need arise. Furthermore, if desired, a dam 40 may be used on all three sides of the flipchip 12 located on the substrate 10 except the side of the flip-chip 12 from which the underfill material 28 is being dispensed.

Referring to FIG. 3, a side view of a flip-chip 12 and substrate 10, interconnected via bumps 24, of a third embodiment of the invention is shown. The substrate 10 is inclined with respect to a horizontal plane 1 by placing the substrate 10 onto a support member 44. Support member 44 can be a tilt table, a tilted conveyor belt, or any other means of support suitable for holding the substrate 10 of the present invention. Preferably, support member 44 can be positioned and locked at various angles and can also be elevated or lowered from front to back as well as side to side.

Attached to the support member 44 is a vibrator 48. The vibrator 48 facilitates and hastens the displacement of air pockets and voids by the underfill material 28 during the previously described underfill process. The action of the vibrator 48 also permits the use of higher viscosity underfill materials and/or permits underfilling with the support member 44 positioned at a gradual slope.

Figure 4:
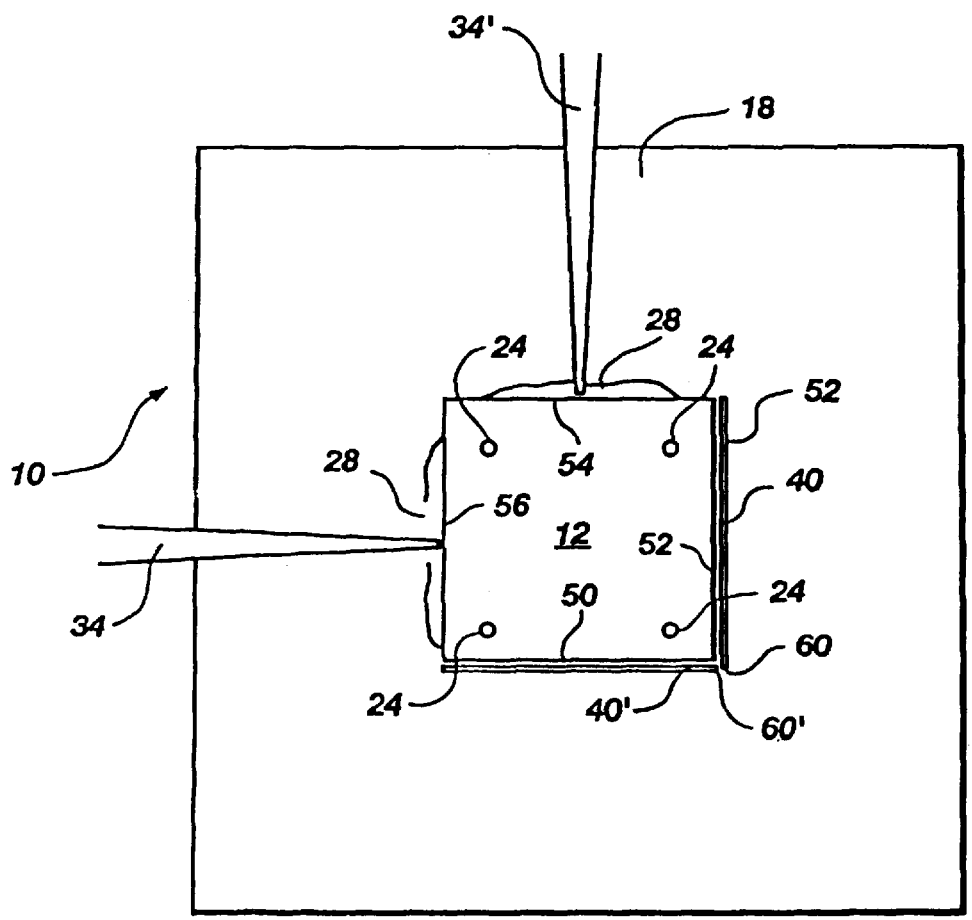
FIG. 4 is a top view of a semiconductor device, bumped flip-chip, and an inclined substrate illustrating the use of two suitable barriers, dams, to perform the underfill step.

Referring to FIG. 4, a top view of an interconnected solder-bumped 24 flip-chip 12 and substrate 10 of a fourth embodiment of the present invention is shown similar to that of the second embodiment as shown in FIG. 2. However, this particular embodiment illustrates the use of two dams 40 and 40', which are oriented transversely with respect to one another. The two dams 40 and 40' lie in substantially parallel orientation with respect to two mutually perpendicular and abutting sidewalls 50 and 52 of the flip-chip 12.

The method of this embodiment permits underfilling along two sidewalls 54 and 56 simultaneously. Dams 40 and 40' prevent the spread and overflow of underfill material 28 beyond sidewalls 50 and 52 of the flip-chip 12. The underfill material may be easily controlled and a wider range of viscosities may be used by controlling the depth of the dams 40 and 40', by controlling the width between the sidewalls 50 and 52 of the flip-chip 12 and the dams 40 and 40', and by controlling the distance between the corners 60 and 60' of the dams 40 and 40'.

An alternative method comprises tilting the substrate 10 so as to elevate sidewall 54 and applying the underfill material 28 under sidewall 54 via the underfill dispenser 34'. The substrate 10 is then tilted so as to elevate sidewall 56 and the underfill material 28 is dispensed along sidewall 56 via underfill dispenser 34. This alternating underfill technique can be repeated until the underfill material 28 is free of air pockets and voids.

Figure 5:
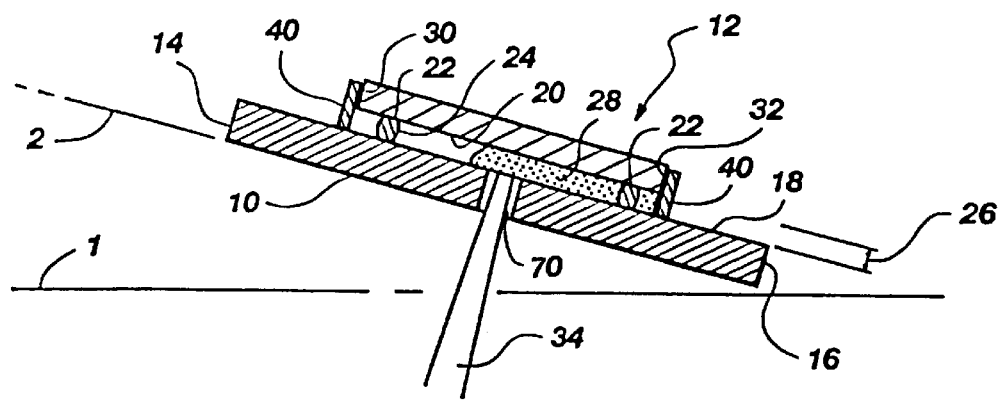
FIG. 5 is a cross-sectional view of another embodiment of the present invention, illustrating a backfill method of underfilling the gap formed between a semiconductor device, bumped flip-chip, and a substrate.

Referring to FIG. 5, a cross-sectional view of an interconnected solder-bumped 24 flip-chip 12 and substrate 10 of a fifth embodiment of the present invention is shown midway through the underfill process. In this particular embodiment, the substrate 10 has a suitable shaped opening 60 situated near the center of the substrate 10 through which underfill material 28 can be applied via the underfill dispenser 34. Additionally, dams 40 and 40' located on each side of the flip-chip 12 are molded or suitably attached to top surface 18 of the substrate 10, as described hereinbefore, being positioned to lay slightly beyond first and second sidewalls, rear sidewall 32, and front sidewall 30, respectively. It should also be understood that other dams 40' (not shown) are located on the first and second lateral sidewalls of the flip-chip 12 to confine the underfill.

Figure 6:
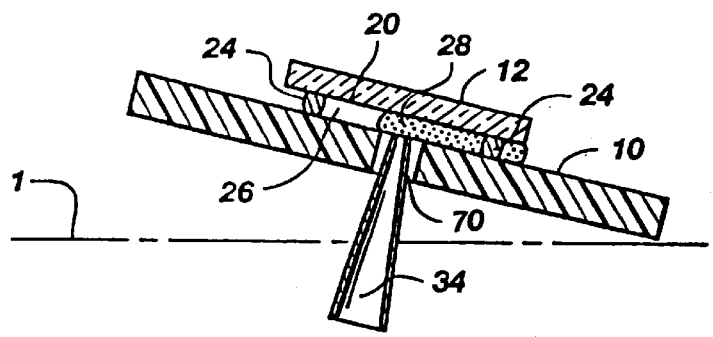
FIG. 6 is a cross-sectional view of another embodiment of the present invention, illustrating a backfill method of underfilling the gap formed between a semiconductor device, a bumped flip-chip, and a substrate without the use of dams.

Referring to drawing FIG. 6, a cross-sectional view of an interconnected solder-bumped 24 flip-chip 12 and substrate 10 of a sixth embodiment of the present invention is shown midway through the underfill process. In this particular embodiment, the substrate 10 has a suitable shaped opening 60 situated near the center of the substrate 10 through which underfill material 28 can be applied via the underfill dispenser 34. In this instance, there is no dam used to confine the underfill material 28. Additionally, if desired, the substrate 10 having flip-chip 12 located thereon may be tilted in each direction to enhance the flow of the underfill material 28 in the gap 26 between the substrate 10 and the flip-chip 12 during the underfilling process.

Figure 7:
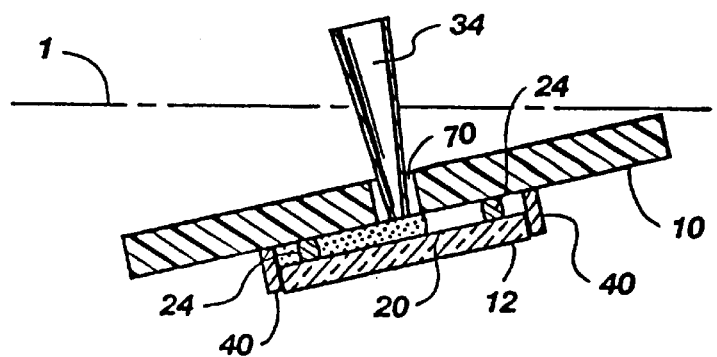
FIG. 7 is a cross-sectional view of another embodiment of the present invention, illustrating a backfill method of underfilling the gap formed between a semiconductor device, a bumped flip-chip, and a substrate wherein the substrate is inverted during the underfilling process.

Referring to drawing FIG. 7, a cross-sectional view of an interconnected solder-bumped 24 flip-chip 12 and substrate 10 of a seventh embodiment of the present invention is shown midway through the underfill process. In this particular embodiment, the substrate 10 has a suitable shaped opening 60 situated near the center of the substrate 10 through which underfill material 28 can be applied via the underfill dispenser 34. Additionally, dams 40 and 40' located on each side of the flip-chip 12 are molded or suitably attached to top surface 18 of the substrate 10, as described hereinbefore, being positioned to lay slightly beyond first and second sidewalls, rear sidewall 32, and front sidewall 30, respectively. It should also be understood that other dams 40' (not shown) are located on the first and second lateral sidewalls of the flip-chip 12 to confine the underfill. In this instance, the substrate 10 having flip-chip 12 located thereon is inverted during the underfill process so that the underfill material 28 is dispensed through the opening 60 into the gap 26 between the substrate 10 and flip-chip 12. As in the previous embodiments, the substrate 10 is located at an angle with respect to horizontal plane 1 although located therebelow and inclined with respect thereto.

In operation, the present method is initiated by elevating or inclining front end 14 of the substrate 10. As the underfill material 28 is added, in this case by means of an opening 60 through the substrate 10, the underfill material 28 flows towards the dam 40 and fills the lowered portion of the gap 26 between the flip-chip 12 and the substrate 10. The front end 14 of the substrate 10 is then lowered and the rear end 16 of the substrate 10 is elevated. The backfill method is then repeated with the underfill material 28 now flowing towards the dam 40' to complete the filling of the gap 26 between the flip-chip 12 and the substrate 10. The underfill material 28 is then cured, as previously described. Alternately, the underfill material 28 may be cured after the partial filling of the gap between the substrate 10 and flip-chip 12, the remainder of the gap filled and subsequently cured.

While the present invention has been described in terms of certain methods and embodiments, it is not so limited, and those of ordinary skill in the art will readily recognize and appreciate that many additions, deletions and modifications to the embodiments described herein may be made without departing from the scope of the invention as hereinafter claimed.

What is claimed is:

1. A method of attaching a semiconductor device to a substrate, said method comprising the steps of:
   connecting the semiconductor device to the substrate;
   raising one end of the substrate to position the substrate and the connected semiconductor device on an inclined plane with respect to a horizontal plane; and
   applying an underfill material substantially adjacent an uppermost elevated portion of the substrate and the semiconductor device.

2. A method of attaching a semiconductor device to a substrate, said method comprising the steps of:
   providing a semiconductor device having an active surface, front wall, rear wall, first lateral sidewall and second lateral sidewall;
   providing a substrate for receiving the semiconductor device, said substrate having a top surface when said top surface faces said active surface a front edge, a rear edge, first lateral edge, and second lateral edge;
   connecting the semiconductor device to the substrate;
   placing the substrate and the connected semiconductor device on an inclined plane with respect to a horizontal plane wherein the front edge is positioned above the rear edge; and
   applying an underfill material substantially adjacent said front wall of the semiconductor device.

3. The method of claim 2, wherein the step of placing the substrate and the connected semiconductor device on an inclined plane with respect to a horizontal plane comprises:
   placing the substrate on a support structure and elevating at least one portion of said support structure.

4. The method of claim 2, further comprising the step of;
   providing a barrier on the substrate at a point adjacent to said rear sidewall of the semiconductor device after said step of connecting the semiconductor device to the substrate.

5. The method of claim 4, wherein said barrier means comprises:
   a barrier extending substantially between the active surface of the semiconductor device and the top surface of the substrate.

6. The method of claim 4, wherein said barrier comprises:
   a barrier extending substantially between the semiconductor device and the substrate, the barrier extending along substantially the first lateral sidewall, second lateral sidewall, and rear wall of the semiconductor device.

7. The method of claim 2, further comprising the step of:
   vibrating the substrate to agitate the underfill material to substantially evacuate entrapped air within said underfill material.

8. The method of claim 7, wherein the step of vibrating the substrate comprises:
   placing the substrate on a support structure and vibrating said support structure.

9. The method of claim 2, further comprising the steps of:
   raising the first lateral edge of the substrate to position the substrate on another inclined plane; and
   placing an underfill material between the substrate and the semiconductor device substantially under the first lateral sidewall of the semiconductor device.

10. The method of claim 9, further comprising the steps of:
    raising said front edge of the substrate;
    placing an underfill material substantially under said front wall of the semiconductor device;
    raising the rear edge of the substrate; and
    placing an underfill material substantially under the rear wall of the semiconductor device.

11. The method of claim 9, further comprising the step of:
    providing a barrier on the substrate at a point adjacent to the first lateral sidewall of the semiconductor device to prevent said underfill material from substantially spreading beyond the first lateral sidewall of the semiconductor device.

12. The method of claim 11, further comprising the step of:
    providing a barrier on the substrate at a point adjacent to the first lateral sidewall, second lateral sidewall, and rear wall of the semiconductor device to prevent said underfill material from substantially spreading therebeyond.

13. The method of claim 11, further comprising the step of:
   raising the first lateral edge of the substrate.

14. The method of claim 9, further comprising the step of:
   vibrating the substrate to agitate said underfill material to substantially evacuate entrapped air within said underfill material.

15. The method of claim 2 wherein the step of connecting the semiconductor device to the substrate comprises the steps of;
   depositing solder upon the semiconductor device; and
   attaching the semiconductor device on the substrate to form an electrical and mechanical connection therebetween by the reflowing of the solder deposited on the semiconductor device.

16. The method of claim 2, wherein the step of providing a semiconductor device comprises:
   attaching a bumped die to the substrate thereby forming a gap between the bumped die and the substrate.

17. The method of claim 2, wherein the step of providing a semiconductor device comprises:
   attaching a semiconductor device to a printed circuit board.

18. A method of attaching a bumped die to a printed circuit board, said method comprising the steps of:
   providing a bumped die having a front sidewall and a rear sidewall, said rear sidewall being opposite to said front sidewall;
   providing a printed circuit board for receiving the bumped die, said printed circuit board having a front end facing said front sidewall of the bumped die and a rear end facing said rear sidewall of the bumped die;
   electrically connecting the bumped die to the printed circuit board;
   providing a barrier on the printed circuit board at a point adjacent to said rear sidewall of
   the bumped die to contain said underfill material;
   raising said front end of the printed circuit board to position the printed circuit board on an inclined plane; and
   applying an underfill material between the printed circuit board and the bumped die substantially under said front sidewall of the bumped die.

19. A method of attaching a semiconductor device to a substrate, said method comprising the steps of:
   connecting the semiconductor device to the substrate;
   raising by inclining one end of the substrate to position the substrate and the connected semiconductor device on an inclined plane with respect to a horizontal plane; and
   applying an underfill material substantially adjacent an uppermost inclined side of the substrate and the semiconductor device.

20. A method of attaching a semiconductor device to a substrate, said method comprising the steps of:
   providing a semiconductor device having front wall, rear wall, first lateral sidewall and second lateral sidewall;
   providing a substrate for receiving the semiconductor device, said substrate having a front edge, a rear edge, first lateral edge, and second lateral edge;
   connecting the semiconductor device to the substrate;
   lowering the front edge of the substrate to position the substrate and the semiconductor device connected thereto on an inclined plane with respect to a horizontal plane; and
   applying an underfill material between the substrate and the semiconductor device substantially adjacent said rear wall of the semiconductor device.

21. The method of claim 20, wherein the step of lowering said front edge of the substrate comprises:
   placing the substrate on a support structure and inclining at least one portion of said support structure.

22. The method of claim 20, further comprising the step of;
   providing a barrier on the substrate at a point adjacent to said front wall of the semiconductor device after said step of connecting the semiconductor device to the substrate.

23. The method of claim 20, wherein said barrier comprises:
   a barrier extending substantially between the semiconductor device and the substrate.

24. The method of claim 23, wherein the step of vibrating the substrate comprises:
   placing the substrate on a support structure and vibrating said support structure.

25. The method of claim 20, wherein said barrier comprises:
   a barrier extending substantially between the semiconductor device and the substrate, the barrier extending along substantially the first lateral sidewall, second lateral sidewall, and front wall of the semiconductor device.

26. The method of claim 20, further comprising the step of:
   vibrating the substrate to agitate the underfill material to substantially evacuate entrapped air within said underfill material.

27. The method of claim 26, further comprising the steps of:
   lowering said front edge of the substrate;
   placing an underfill material substantially under said rear wall of the semiconductor device;
   lowering the rear edge of the substrate; and
   placing an underfill material substantially under the front wall of the semiconductor device.

28. The method of claim 27, further comprising the step of:
   lowering the first lateral edge of the substrate.

29. The method of claim 26, further comprising the step of:
   providing a barrier on the substrate at a point adjacent to the first lateral sidewall of the semiconductor device to prevent said underfill material from substantially spreading beyond the first lateral sidewall of the semiconductor device.

30. The method of claim 26, further comprising the step of:
   providing a barrier on the substrate at a point adjacent to the first lateral sidewall, second lateral sidewall, and front wall of the semiconductor device to prevent said underfill material from substantially spreading therebeyond.

31. The method of claim 26, further comprising the step of:
   vibrating the substrate to agitate said underfill material to substantially evacuate entrapped air within said underfill material.

32. The method of claim 20, further comprising the steps of:

lowering the first lateral edge of the substrate to position the substrate on another inclined plane; and placing an underfill material between the substrate and the semiconductor device substantially under the second lateral sidewall of the semiconductor device.

33. The method of claim 20, wherein the step of connecting the semiconductor device to the substrate comprises the steps of;

depositing solder upon the semiconductor device; and attaching the semiconductor device on the substrate to form an electrical and mechanical connection therebetween by the reflowing of the solder deposited on the semiconductor device.

34. The method of claim 20, wherein the step of providing a semiconductor device comprises:

attaching a bumped die to the substrate thereby forming a gap between the bumped die and the substrate.

35. The method of claim 20, wherein the step of providing a semiconductor device comprises:

attaching a semiconductor device to a printed circuit board.

36. A method of attaching a bumped die to a printed circuit board, said method comprising the steps of:

providing a bumped die having a front sidewall and a rear sidewall, said rear sidewall being opposite to said front sidewall;

providing a printed circuit board for receiving the bumped die, said printed circuit board having a front end facing said front sidewall of the bumped die and a rear end facing said rear sidewall of the bumped die;

connecting the bumped die to the printed circuit board;

providing a barrier on the printed circuit board at a point adjacent to said rear sidewall of the bumped die to prevent said underfill material from spreading beyond said rear sidewall of the bumped die;

raising by inclining said front end of the printed circuit board to position the printed circuit board on an inclined plane; and applying an underfill material between the printed circuit board and the bumped die.

* * * * *

UNITED STATES PATENT AND TRADEMARK OFFICE
CERTIFICATE OF CORRECTION

PATENT NO.    : 6,194,243 B1  
DATED         : February 27, 2001  
INVENTOR(S)   : Salman Akram and James M. Wark It is certified that error appears in the above-identified patent and that said Letters Patent is hereby corrected as shown below:

<u>Title page, Item [54] and Column 1, line 1,</u>  
Title, change "PRODUCTION" to -- PRODUCING --

<u>Drawings,</u>  
FIG. 4, delete second reference numeral "52" and lead line therefore on the far right outside area  
Please replace FIG. 4 with the following:
--

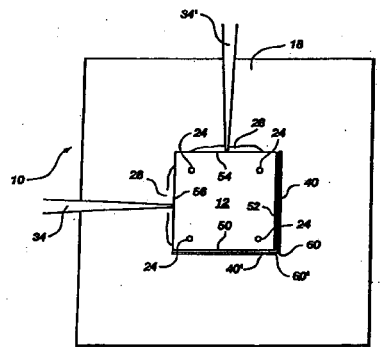

Fig. 4

--

FIG. 7, insert reference numerals --14 --, -- 16 --, -- 18 --, -- 28 --, -- 30 --, and -- 32 -- with appropriate lead lines  
Please replace FIG. 7 with the following:
--

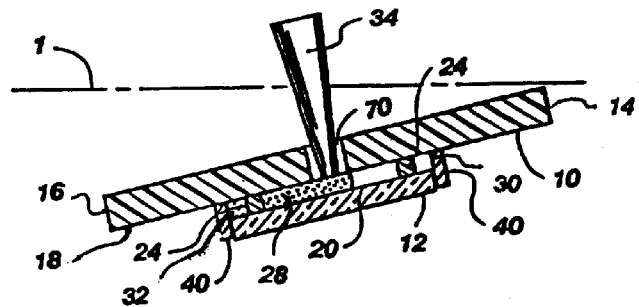

Fig. 7

--

UNITED STATES PATENT AND TRADEMARK OFFICE
CERTIFICATE OF CORRECTION

PATENT NO.     : 6,194,243 B1
DATED          : February 27, 2001
INVENTOR(S)    : Salman Akram and James M. Wark It is certified that error appears in the above-identified patent and that said Letters Patent is hereby corrected as shown below:

Column 1,
Line 7, change "APPLICATION" to -- APPLICATIONS --
Line 33, change "solderjoint" to -- solder joint --

Column 4,
Line 7, after "upon" insert -- the --
Line 27, before "help" insert -- to --
Line 28, after "prevent" delete "," and insert -- and/or --
Line 29, after "24" insert -- , --

Column 5,
Line 61, change "flipchip" to -- flip-chip --

Column 6,
Line 47, change "60" to -- 70 --
Line 62, change "60" to -- 70 --

Column 7,
Line 9, change "60" to -- 70 --
Line 21, change "60" to -- 70 --
Line 28, change "60" to -- 70 --
Line 60, after "providing" change "a" to -- said --
Line 63, after "providing" change "a" to -- said --
Line 65, after "surface" insert -- , --

Column 8,
Line 13, change ";" to -- : --
Line 14, after "barrier" insert -- means --
Line 15, change "sidewall" to -- wall --
Line 23, after "barrier" insert -- means --
Line 40, change "an" to -- said --
Line 46, change "an" to -- said --
Line 49, change "an" to -- said --
Line 59, after "providing" change "a" to -- said --

UNITED STATES PATENT AND TRADEMARK OFFICE
CERTIFICATE OF CORRECTION

PATENT NO. : 6,194,243 B1
DATED : February 27, 2001
INVENTOR(S) : Salman Akram and James M. Wark It is certified that error appears in the above-identified patent and that said Letters Patent is hereby corrected as shown below:

Column 9,
Line 10, change ";" to -- : --
Line 17, change "a" to -- said --
Line 21, change "a" to -- said --
Line 22, after "attaching" change "a" to -- said --
Line 26, after "providing" change "a" to -- said --
Line 29, after "providing" change "a" to -- said --
Line 37, change "said" to -- an --
Line 41, after "applying" change "an" to -- said --
Line 55, after "providing" change "a" to -- said -- and after "having" insert -- a --
Line 57, after "providing" change "a" to -- said --

Column 10,
Line 9, change ";" to -- : --
Line 14, change "claim 20" to -- claim 22 --
Line 16, change "a barrier" to -- said barrier --
Line 18, change "claim 23" to -- claim 26 --
Line 22, change "claim 20" to -- claim 22 --
Line 24, change "a barrier" to -- said barrier --
Line 37, change "an" to -- said --
Line 40, after "placing" change "an" to -- said --

Column 11,
Line 5, after "placing" change "an" to -- said --
Line 10, change ";" to -- : --
Line 17, change "a" to -- said --
Line 21, change "a" to -- said --
Line 22, after "attaching" change "a" to -- said --

UNITED STATES PATENT AND TRADEMARK OFFICE
CERTIFICATE OF CORRECTION

PATENT NO.   : 6,194,243 B1
DATED        : February 27, 2001
INVENTOR(S)  : Salman Akram and James M. Wark It is certified that error appears in the above-identified patent and that said Letters Patent is hereby corrected as shown below:

<u>Column 12,</u>
Line 3, after "providing" change "a" to -- said --
Line 6, after "providing" change "a" to -- said --
Line 13, change "said" to -- an --

Signed and Sealed this

Twenty-sixth Day of November, 2002

Attest:

Attesting Officer

JAMES E. ROGAN
Director of the United States Patent and Trademark Office